(12) United States Patent
Newman et al.

(10) Patent No.: US 6,326,802 B1
(45) Date of Patent: Dec. 4, 2001

(54) ON-DIE ADAPTIVE ARRANGEMENTS FOR CONTINUOUS PROCESS, VOLTAGE AND TEMPERATURE COMPENSATION

(75) Inventors: Paul F. Newman, Hillsboro; Jeff R. Jones, Aloha; Greg Taylor, Portland; Chee Bow Lim, Hillsboro, all of OR (US); Gerald Pasdast, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/409,387

(22) Filed: Sep. 30, 1999

(51) Int. Cl.[7] .............................................. H03K 19/0185
(52) U.S. Cl. ............................... 326/30; 326/83; 326/87; 326/27
(58) Field of Search ..................... 326/30, 83, 86, 326/87, 21, 27

(56) References Cited

U.S. PATENT DOCUMENTS

| | | | |
|---|---|---|---|
| 5,095,231 * | 3/1992 | Sartori et al. .......................... 326/83 |
| 5,134,311 * | 7/1992 | Biber et al. ............................ 326/87 |
| 5,559,447 * | 9/1996 | Rees ...................................... 326/30 |
| 5,677,639 * | 10/1997 | Masiewicz ............................. 326/30 |
| 5,955,894 * | 9/1999 | Vishwanthaiah et al. ............. 326/30 |
| 6,114,898 * | 9/2000 | Okayasu ................................ 326/30 |

* cited by examiner

*Primary Examiner*—Michael Tokar
*Assistant Examiner*—Don Phu Le
(74) *Attorney, Agent, or Firm*—Antonelli, Terry, Stout & Kraus, LLP

(57) ABSTRACT

An impedance matching arrangement, including an adaptive circuit. The adaptive circuit includes a first adaptive portion allowing impedance matching according to a predetermined first weighting scheme, and a second adaptive portion allowing impedance matching according to a predetermined second weighting scheme which differs from the first weighting scheme. The first adaptive portion is operable substantially during initialization times, and the second adaptive portion is operable substantially outside initialization times. The first adaptive portion may have a binary weighting scheme, and the second adaptive portion may have a linear weighting scheme. Finally, the adaptive 1 circuit is provided as a portion of an integrated circuit (IC) die.

23 Claims, 5 Drawing Sheets

FIG. 2
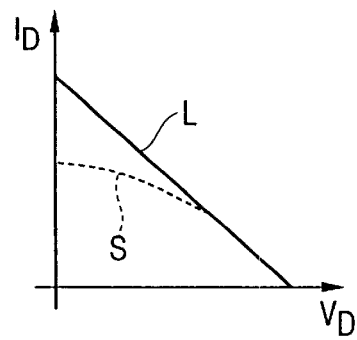
FIG. 3
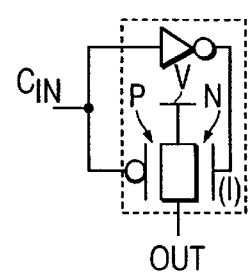
FIG. 12
|  | BINARY BITS | THERMOMETER BITS |
|---|---|---|
| BIT WEIGHT | 8 4 2 1 | 1 1 1 1 1 1 1 1 |
| DURING RESET | T R A K | 1 1 1 1 0 0 0 0 |
| AFTER RESET | L O C K | T R A C K I N G |
FIG. 13
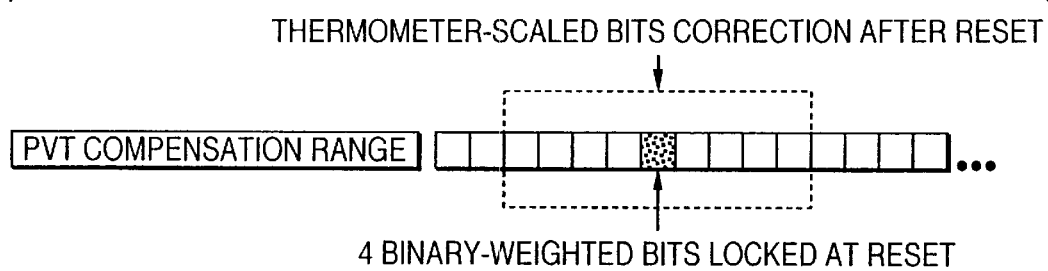

US 6,326,802 B1

ON-DIE ADAPTIVE ARRANGEMENTS FOR CONTINUOUS PROCESS, VOLTAGE AND TEMPERATURE COMPENSATION

FIELD

The invention relates to on-die adaptive arrangements for continuous process, voltage and temperature (PVT) compensation for termination impedances.

BACKGROUND

In the world of electrical signal transmission, it is known that if a traveling signal experiences any discontinuity (e.g., change in impedance) along a transmission path, such signal can experience undesirous effects such as signal reflection. More particularly, referencing FIG. 1 for background discussion, shown is a first integrated circuit (IC) numbered $IC_A$, a second IC numbered $IC_B$, and a plurality of transmission lines $IL_{N-1}$, $IL_N$, $IL_{N+1}$ connected to input/output terminals and providing signal transmission paths therebetween, with the illustration of "•••" within such FIG. being indicative that there may be many more (e.g., hundreds of) input terminals and transmission lines interconnected therebetween. The transmission lines $IL_{N-1}$, $IL_N$, $IL_{N+1}$ will have a characteristic impedance, e.g., 50 ohms ($\Omega$). If $IC_B$ outputs a signal SIG from an input/output (I/O) terminal onto transmission line $IL_{N-1}$, such signal SIG will travel along transmission line $IL_{N-1}$, and unless an I/O terminal of $IC_A$ is impedance matched to the characteristic impedance of the transmission line $IL_{N-1}$, such traveling signal will experience discontinuity and will experience undesirous effects such as a signal reflection REFL. Such reflection REFL is undesirous because it lessens a signal strength of the signal SIG which is actually inputted into $IC_A$, and travels back to $IC_B$. It may then reflect back from $IC_B$ if it is not matched to the transmission line impedance, and this reflection may interfere with subsequent signal reception at $IC_A$.

As one method to avoid substantial impedance mismatch, an impedance such as an external resistor $R_{EXT}$ (FIG. 1) may be provided at each I/O terminal so as to impedance match the I/O terminal to the transmission line. With such impedance matching, little discontinuity and thus minimal reflections are experienced by a traveling signal at the end of the line. The problem with this approach is that typically a respective precision impedance (e.g., resistor) is needed for each I/O terminal, such precision impedances being relatively high in cost. Further, manufacturing costs, time and complexity are increased because the precision impedances must be connected to the respective I/O terminals. Still further, the external impedances take up valuable space (aka, real estate) on a printed circuit board (PCB), which is disadvantageous in the present trend of the computer industry to provide more and more dense and compacted apparatus (e.g., computers, servers, etc.).

While it would be nice to be able to provide precision resistors internally (i.e., on-die) within an IC, IC manufacturing processes vary substantially from manufacturing lot to manufacturing lot, and as a result of such manufacturing variations, IC components correspondingly vary making it very difficult and/or cost prohibitive to provide/guarantee such precision resistors. Further, even if such precision resistors could be provided on-die, such approach would still be disadvantageous in that use of precision resistors is a static technique which would not allow for adjustment at the time of IC installation to varying transmission lines, and which would not allow for continuous process, voltage and temperature compensations. That is, voltage and temperature environments, for example, within an IC and/or on signal transmission lines change over time during the operation of an apparatus, and accordingly, any matching arrangement should continuously be "adaptive" to such changes over time.

SUMMARY

The invention is directed to an impedance matching arrangement, including an adaptive circuit. The adaptive circuit includes a first adaptive portion allowing impedance matching according to a predetermined first weighting scheme, and a second adaptive portion allowing impedance matching according to a predetermined second weighting scheme which differs from the first weighting scheme.

BRIEF DESCRIPTION OF THE DRAWINGS

The foregoing and a better understanding of the present invention will become apparent from the following detailed description of exemplary embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein:

FIG. 2 is a graph describing theory behind transistor blocks which may be used in on-die adaptive arrangements of the present invention;

FIG. 3 is a circuit diagram describing a transistor block which may be used in on-die adaptive arrangements of the present invention;

FIG. 12 is a table describing example operations with respect to binary and linear (thermometer) bits of the FIG. 11 hybrid binary/linear adaptive arrangement; and FIG. 13 is an illustration of an example compensation range with respect to the FIG. 11 example hybrid binary/linear adaptive arrangement.

DETAILED DESCRIPTION

Figure 1:
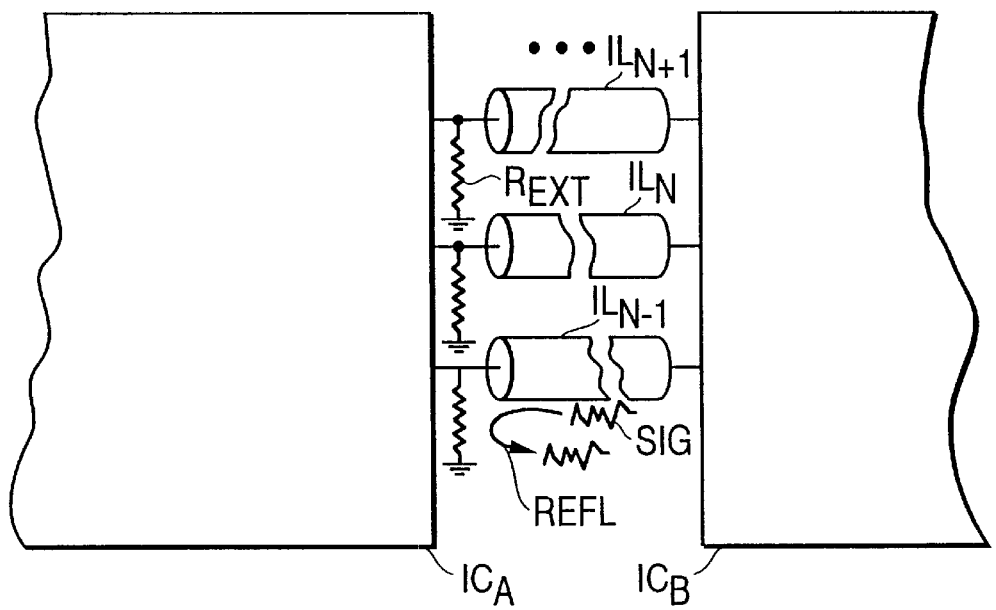
FIG. 1 is a plan view of two ICs having signal transmission paths arranged therebetween, such FIG. being useful in describing background to the invention.

Before beginning a detailed description of the subject invention, mention of the following is in order. When appropriate, like reference numerals and characters may be used to designate identical, corresponding or similar components in differing figure drawings. Further, in the detailed description to follow, exemplary sizes/models/values/ranges may be given (e.g., in parenthesis), although the present invention is not limited to the same. Still further, any graphs, clock and timing signal FIGS. are not drawn to scale, and instead, exemplary and critical values are mentioned when appropriate. With regard to description of any timing signals, the terms assertion/activate and negation/deactivate are used in an intended generic sense. More particularly, such terms are used to avoid confusion when working with a mixture of signals, and to represent the fact that the invention is not limited to the illustrated/described signals, but could be implemented with a total/partial reversal of any of the "active-low" and "active-high" signals by a simple change in logic. More specifically, the terms assertion/activate indicate that a signal is active independent of whether that level is represented by a high or low voltage, while the terms negation/deactivate indicate that a signal is inactive. As a final note, well known power connections to ICs and other components may not be shown within the FIGS. for simplicity of illustration and discussion, and so as not to obscure the invention.

Turning now to detailed description, as mentioned above, it is very difficult and/or cost prohibitive to provide precision resistors internally (i.e., on-die) within an IC, for use in impedance matching I/O terminals to signal transmission lines. In contrast, it is relatively easy to provide transistors internally (i.e., on-die) within an IC, and such transistors can be constructed/arranged to provide impedance, e.g., resistance. The present invention takes advantage of the fact that while it is very difficult and/or cost prohibitive to control manufacturing variations so as to achieve consistent transistor sizes from die-to-die, transistors on a same die are generally substantially evenly matched. Accordingly, the present invention utilizes the construction/arrangement of a plurality of substantially equally matched transistors which can be selectively activated/deactivated in parallel (i.e., as will become apparent in the discussions to follow). In addition to utilizing on-die matched transistors, the present invention also utilizes a special arrangement of transistors in order to achieve/mimic an impedance having a linear voltage-current (V-I) characteristic curve.

More particularly, while an actual resistor has a linear voltage-current (V-I) characteristic curve such as that illustrated as straight line L in the graph of FIG. 2 (illustrating a graph of a transistor's drain terminal voltage verses drain terminal current), FIG. 2 shows that a transistor has a partial linear and partial non-linear V-I characteristic curve such as that illustrated as by line S. To combat such non-linearity, it has been found that differing types (e.g., P-type and N-type) of transistors can be arranged/operated in parallel, so as to provide a "resistance" which has a linear voltage-current (V-I) characteristic curve such as that illustrated as straight line L in the graph of FIG. 2.

More particularly, FIG. 3 is a circuit diagram describing an example transistor circuit which may be provided on-die for adaptive arrangements of the present invention. Shown is a combination of a P-type transistor P and an N-type transistor N, connected in parallel across a voltage source V and an output OUT. A control input $C_{IN}$ is connected to the gate of the P transistor, and is also connected through an inverter to the gate of the N transistor. Accordingly, whenever the appropriate control input $C_{IN}$ is applied, both the P and N transistors are on simultaneously. By tweaking and selecting P and N to differing sizes, the linear voltage-current (V-I) characteristic curve L illustrated in the graph of FIG. 2 can be achieved.

The example parallel combination of the P and N transistors is advantageous in terms of space savings on-die in that such transistors share common voltage source V and output OUT connections. A singular parallel pair of a P and N transistors will hereinafter in this disclosure sometimes be referred to as representing one P/N transistor "leg", and a designation "(1)" is used within the lower right-hand corner of blocks (e.g., see FIG. 3 block, FIG. 5 BTB1 block, etc.) to numerically designate that such block has one (1) leg (similarly, see BTB1 block in FIG. 5).

A one leg block provides a certain value of resistance, e.g., 500Ω. In contrast, a plurality of legs can be placed in a series and/or parallel arrangement with one another, and ones of such legs can be selectively activated/deactivated to provide a plurality of different values of resistance. For sake of brevity of discussion, this disclosure will focus on arrangements having a plurality of legs in parallel (not series), as will become more apparent from the disclosure to follow, although the invention is not limited to the same.

Figure 4:
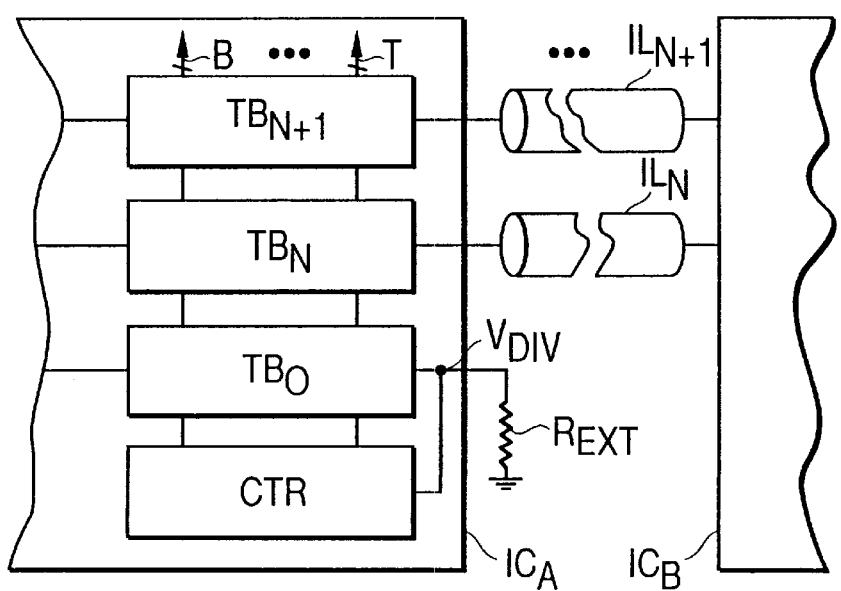
FIG. 4 is a plan view including block diagrams describing a general layout which may be provided on-die for adaptive arrangements of the present invention.

Turning now to FIG. 4, FIG. 4 is a plan view including block diagrams describing an example general layout which may be provided on-die for the adaptive arrangements of the present invention. More particularly, illustrated is an $IC_A'$ having an example generic on-die arrangement of a controller CTR block, and a plurality of transistor blocks $TB_0$, $TB_N$, $TB_{N+1}$, with the illustration of "•••" within such FIG. being indicative that there may be many more (e.g., hundreds of) transistor blocks. The internal constructions/arrangements within all of the transistor blocks $TB_0$, $TB_N$, $TB_{N+1}$, ••• may be identical, which is advantageous in terms of using redundancy during design/manufacturing of $IC_A'$. Transistor block $TB_N$ is connected to an I/O terminal (not shown) of $IC_A'$, which in turn is connected to transmission line $IL_N$; transistor block $TB_{N+1}$ is connected to a different I/O terminal which in turn is connected to transmission line $IL_{N+1}$; and so on.

In contrast to $TB_N$, $TB_{N+1}$ which service transmission lines, transistor block $TB_0$ is used as a reference transistor block. Such reference transistor block is used (example embodiments disclosed ahead) together with controller CTR and external resistor $R_{EXT}$ to determine which ones and/or how many of parallel legs of transistors must be turned on to impedance match an expected characteristic impedance of a transmission line connected to any I/O terminal of $IC_A'$. While the present disclosure describes an embodiment having a single reference transistor block $TB_0$ and a single controller CTR, practice of the present invention is not limited thereto, i.e., there can easily be multiple reference transistor blocks and multiple controllers provided on a single die. Such may be advantageous in a number of regards. For example, temperatures can vary greatly across a die, and thus, localized reference transistor blocks and controllers can be used to provide more accurate localized compensation. Further, redundant reference transistor blocks and controllers could offer back-up protections in the event of failure or one of the reference transistor blocks or controller.

In continuing discussion, typically the characteristic impedance of transmission lines connected to I/O terminals of $IC_A'$ are known and/or can be measured, and once known or measured, a precision external resistor $R_{EXT}$ of corresponding value may be provided on the printed circuit board to serve as a reference impedance to attempt to match to. Alternatively, instead of precision external resistor $R_{EXT}$, other types of arrangements can be used, e.g., a dummy transmission line $IL_D$ (not shown) having a similar impedance as other transmission lines $IL_N$, $IL_{N+1}$, ••• may be used, or one of the actual transmission lines $IL_N$, $IL_{N+1}$, ••• may be used (e.g., during inactive times).

An example method which may be used to match the impedance provided by the reference transistor block $TB_0$ to the external resistor $R_{EXT}$ can be explained as follow. When appropriate ones and/or number of parallel legs of transistors within transistor block $TB_0$ are turned on (i.e., activated) such that a voltage measured at point $V_{div}$ is one half ($\frac{1}{2}$) a voltage V impressed across the series combination of the external resistor $R_{EXT}$ and the active parallel legs of transistors within transistor block $TB_0$, then it is known that the external resistor $R_{EXT}$ and active parallel legs of transistors within transistor block $TB_0$ are equally sharing/dividing the voltage V. That is, if two series portions are equally sharing/dividing a voltage, then such two series portions have the same impedance. Accordingly, as a result of the above method, $TB_0$ has had the resistance it applies to line $L_0$ "adapted" to external resistor $R_{EXT}$, as the active parallel legs of transistors within transistor block $TB_0$ are providing an impedance (e.g., resistance) which matches that of external resistor $R_{EXT}$.

Once it is known as to which parallel legs of transistors should be turned on within the reference transistor block $TB_0$ to impedance match to the external resistor $R_{EXT}$, such information can be routed to all other on-die transistor blocks so as to activate corresponding parallel legs of transistors within each transistor block. Such will cause all such on-die transistor blocks to provide an impedance (e.g., resistance) which matches the characteristic impedance (e.g., resistance) of attached transmission lines IL, given the fact that the value of external resistor $R_{EXT}$ was originally chosen to match the expected characteristic impedance of the transmission lines IL. Routing of such information to transistor blocks TB across the die can be accomplished using an appropriate number of routing bit lines (such as FIG. 4 binary bit lines B and/or thermometer bit lines T) which traverse transistor blocks TB of interest. In the interest of brevity, routing will not be substantially discussed again, and instead, a remainder of this disclosure will focus moreso on example constructions/arrangements/operations of reference transistor blocks.

The above "adaptive" procedure of monitoring the voltage measured at point $V_{div}$, turning on appropriate ones and/or numbers of transistor legs within reference transistor block $TB_0$ to impedance match, and routing such information to correspondingly activate all other on-die transistor blocks $TB_N$, $TB_{N+1}$, ••• to impedance match, may be performed not only upon initialization (e.g., reset) of the apparatus embodying $IC_A'$, but may also be continuously or periodically performed throughout an operation time of the apparatus. Such continuous/periodic operation is advantageous because environmental parameters (e.g., voltage, temperature, etc.) of the apparatus change over time (e.g., the apparatus becomes hotter with operation which changes on-die impedances), and thus the arrangements of the present invention can be adaptive to change continuously/periodically.

Continuing discussion, the FIG. 4 arrangement is advantageous over the FIG. 1 arrangement in that, at most, only one precision external resistor $R_{EXT}$ need be provided per IC, and hence, additional manufacturing costs, time, complexity, and PCB space (i.e., real estate) consumption, associated with the numerous FIG. 1 resistors per IC are avoided. Accordingly, the FIG. 4 arrangement allows the construction of more and more dense and compacted apparatus (e.g., computers, servers, etc.).

Figure 5:
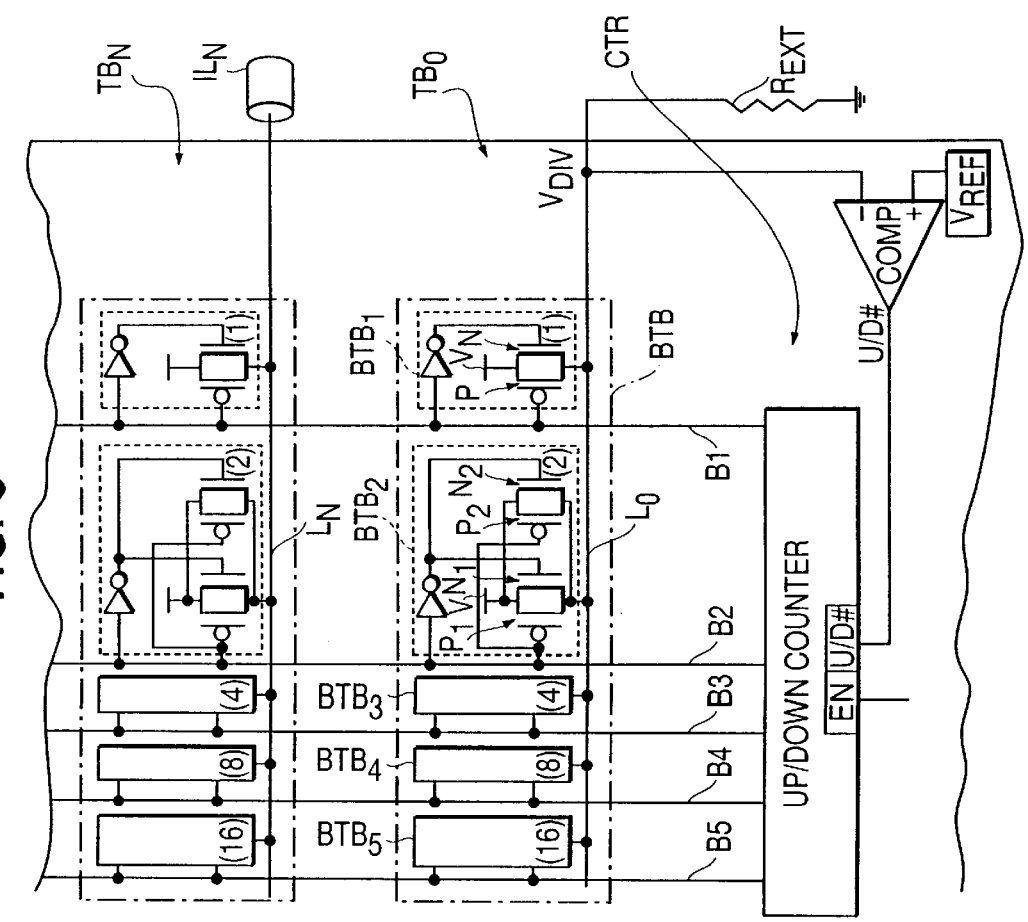
FIG. 5 is a magnified and more detailed view of a portion of FIG. 4, with FIG. 5 illustrating details of an example binary adaptive arrangement.

Turning now to a more specific example embodiment, FIG. 5 is a magnified and more detailed view of a portion of FIG. 4, with FIG. 5 illustrating details of an example binary adaptive arrangement. More particularly, a binary adaptive arrangement is explained as follows. As mentioned above, FIG. 3 is illustrative of an arrangement having a singular parallel pair or "leg" of P and N transistors. A similar single legged arrangement is likewise shown as binary transistor block $BTB_1$, with a designation "(1)" again being used within the lower right-hand corner of such block to numerically designate that such block has one (1) leg. In contrast, FIG. 5's binary transistor block $BTB_2$ has a binary increase (over the previous binary transistor block $BTB_1$) of two (2) legs or pairs of P and N transistors, with a designation "(2)" now being used within the lower right-hand corner of such block to numerically designate that such block has two (2) legs. Advancing FIG. 5 discussion further, binary transistor block $BTB_3$ has a binary increase or (4) legs or pairs of P and N transistors (as indicated by the designation "(4)" being used within the lower portion of such block), binary transistor block $BTB_4$ has a binary increase or (8) legs or pairs of P and N transistors (as indicated by the designation "(8)" being used within the lower portion of such block), and finally, binary transistor block $BTB_5$ has a binary increase or (16) legs or pairs of P and N transistors (as indicated by the designation "(16)" being used within the lower portion of such block). The binary transistor blocks $BTB_2$, $BTB_3$, $BTB_4$, $BTB_5$, have an advantage that each has a capability where multiple legs or pairs of P and N transistors can be arranged to be controlled (e.g., activated) by a respective, singular common binary bit line B, i.e., $BTB_2$ has two (2) P/N transistor legs or pairs which can be controlled by a single common binary bit line $B_2$, $BTB_3$ has four (4) P/N transistor legs or pairs which can be controlled by a single common binary bit line $B_3$, $BTB_4$ has eight (8) P/N transistor legs or pairs which can be controlled by a single common binary bit line $B_4$, and $BTB_5$ has sixteen (16) P/N transistor legs or pairs which can be controlled by a single common binary bit line B5. More particularly, thirty-one (31) P/N transistor legs or pairs may be controlled by a total of five binary bit lines $B_1$, $B_2$, $B_3$, $B_4$, $B_5$.

In addition, by applying appropriate assertion (i.e., activating) signals to appropriate ones or combinations of binary bit lines $B_1$, $B_2$, $B_3$, $B_4$, $B_5$, any number of P/N transistor legs or pairs from one leg to thirty-one legs may be activated so as to provide any one of thirty-one differing resistance values, i.e., activation of one leg would provide a greatest resistance value, whereas activation of all thirty-one parallel legs would provide the least resistance value.

The FIG. 5 thirty-one leg/resistance range is an example only, i.e., the number of the legs which should be constructed/arranged for binary transistor blocks within any given die implementation should be determined on a basis of an acceptable resistance range which could be needed to compensate for all possible IC manufacturing and operation (e.g., temperature, voltage) variations. For example, die meant for use in general applications and/or within normal environments might require a predetermined resistance range, whereas die meant for use in military, space or high performance applications or environments might require a higher resistance range (i.e., military, etc., applications typically experience a wider range of temperature variations, which causes a wider variation of resistance changes).

Figure 6:
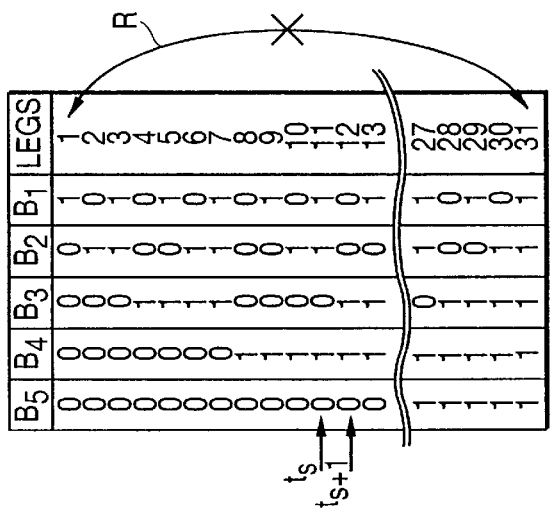
FIG. 6 is a table (having a partial cut-away for compactness of illustration) useful in describing operation of the FIG. 5 binary adaptive arrangement.

Continuing discussion, attention is now directed to the FIG. 6 table which illustrates a binary count sequence which can be applied as assertion signals to binary bit lines $B_1$, $B_2$, $B_3$, $B_4$, $B_5$, and the number of corresponding P/N transistor legs or pairs which are activated at each binary count. For example, if a binary count value of "00111" is applied to binary bit lines $B_5$, $B_4$, $B_3$, $B_2$, $B_1$, seven (7) P/N transistor legs or pairs would be activated in parallel to each other, and would provide a corresponding resistance value connected to a line $L_0$.

With the above as background, discussion continues with further construction and operational details of the FIG. 5 arrangement. More particularly, the outputs of all of the binary transistor blocks $BTB_1$, $BTB_2$, $BTB_3$, $BTB_4$, $BTB_5$, are connected to line $L_0$ which is connected to the I/O terminal of $IC_A'$, which in turn is connected to precision external resistor $R_{EXT}$. In addition, a comparator COMP is connected to receive a voltage from the point $V_{div}$ and to compare the same to a reference voltage $V_{ref}$ which may be equivalent to one half (½) the voltage which is impressed across the combination of both the external resistor $R_{EXT}$ and the active parallel legs of transistors within transistor block $TB_0$. If $V_{div}$ is larger than $V_{ref}$, the comparator COMP outputs a count down signal D as a signal to decrease a number of legs which are active so as to increase the resistance provided by $TB_0$. In contrast, If $V_{div}$ is smaller than $V_{ref}$, the comparator COMP outputs a count up signal U as a signal to increase a number of legs which are active so as to decrease the resistance provided by $TB_0$. The comparator COMP may be constructed to produce no output or invoke no count-up or count-down at times when $V_{div}$ is equal to $V_{ref}$. An Up/Down Counter connected to receive the signal U/D, will count up in a binary fashion (such as shown within the FIG. 6 table) responsive to count up signal U or will count down responsive to count down signal D.

The FIG. 5 arrangement may be constructed/arranged to begin with any initial count value upon initialization. For example, the Up/Down Counter may be pre-loaded with a count of one or "00001" upon initialization. However, pre-loading at the end of the range has the disadvantage that the adaptive operation may take a substantial period of time in cases where the Up/Down Counter must count across a majority of the range (e.g., to a high count value (e.g., 28 out of 31)) to adapt the impedance to $R_{ext}$. Alternatively, the Up/Down Counter may be pre-loaded with a mid-range count value, e.g., of binary fifteen or "01111", in an attempt to minimize a possible range which might have to be traversed and a time which might be needed during initialization.

As mentioned previously, the "adaptive" procedure may be performed only upon initialization or may also be continuously or periodically performed throughout an operation time of the apparatus. To accommodate such selectivity, the FIG. 5 Up/Down Counter has an enable input EN to selectively enable/disable continued count up/down, and which can be selectively enabled for times when the adaptive procedure is desired to be performed. The present invention is not limited to such arrangement, and alternatively, other FIG. 5 components can be arranged to instead allow selective enabling of the adaptive procedure, e.g., the comparator may be arranged to selectively enable/disable feedback of the count signal U/D; a latch can be provided to latch the count value from the Up/Down counter and apply the same to the binary bit lines $B_1$, $B_2$, $B_3$, $B_4$, $B_5$; etc.

A toggle condition should also be mentioned with respect to the FIG. 5 comparator COMP feedback loop (such toggle condition may be applicable to other example FIGs). More particularly, note that if $TB_0$ cannot provide a resistance which exactly matches that of $R_{ext}$, then sequential feedback cycles through the COMP feedback loop would cause the Up/Down counter to toggle back and forth between an up/down count. More specifically, when $TB_0$ provided a resistance which was slightly lower in value than $R_{ext}$, the arrangement would cause count down in an attempt to raise and match the resistance $R_{ext}$, only to result in $TB_0$ providing a resistance which was slightly higher in value than $R_{ext}$. Conversely, when $TB_0$ provided a resistance which was slightly higher in value than $R_{ext}$, the arrangement would cause count up in an attempt to lower and match the resistance $R_{ext}$, only to result in $TB_0$ providing a resistance which was slightly lower in value than $R_{ext}$, and the race/toggle procedure would begin over again. If the toggle condition proved undesirable in the FIG. 5 (or other FIGs.) arrangement, special circuit arrangements could be made to inhibit further counting or feedback during times when $TB_0$ provided a resistance which was within a predetermined range of $R_{ext}$.

Figure 7:
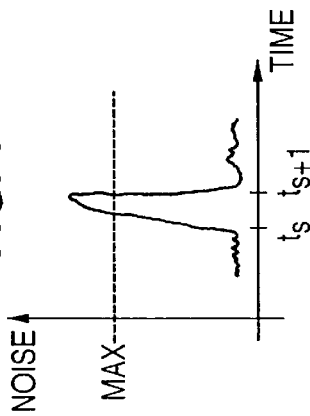
FIG. 7 is a graph describing a disadvantage of the FIG. 5 binary adaptive arrangement.

While the FIG. 5 arrangement is advantageous in terms of minimizing a number of binary bit lines which must be provided to control the P/N transistor legs, FIG. 5 is disadvantageous in terms of noise which may be produced when activating/deactivating P/N transistor legs. More particularly, it is very difficult (if not impossible) to guarantee that ones of binary transistor blocks $BTB_1$, $BTB_2$, $BTB_3$, $BTB_4$, $BTB_5$, can be switched on simultaneously while other ones of $BTB_1$, $BTB_2$, $BTB_3$, $BTB_4$, $BTB_5$, are being switched off while performing adaptive adjustment. FIGS. 6 and 7 will be used to describe one example of such situation, and a disadvantage resultant therefrom.

More particularly, assume that at a first switching time $t_s$ the Up/Down Counter is at a binary count of "01011" having eleven (11) total legs within $BTB_1$, $BTB_2$, $BTB_4$, active, and that at a subsequent switching time $t_{s+1}$, the Up/Down Counter is counted to a next binary count of "01100" having twelve (12) total legs within $BTB_3$, $BTB_4$, active. If $BTB_1$, $BTB_2$ (containing three P/N transistor legs) are deactivated before $BTB_3$ (containing four P/N transistor legs) is activated, the transistor block $TB_0$ initially having eleven legs (11) active will first transition to having only eight (8) legs active, and then will jump to having twelve (12) legs active. Such jumps in active P/N transistor legs correspondingly result in jumps in impedance impressed by transistor block $TB_0$ upon line $L_0$, and all other on-die transistor blocks $TB_N$, $TB_{N+1}$, •••, conduct similar switching/jumping. The result is widely varying impedance matching over time which might cause partial reflection of a signal incoming from a transmission line IL. Further, if a transmission line is low because one of the drivers is active, the impedance transition may launch a wave onto the transmission line. If a maximum noise level acceptable by ICs upon the lines L and transmission lines IL (without causing erroneous operation) is given by MAX in the FIG. 7 time/noise graph, the switching/jumping may result in an unacceptable noise glitch as illustrated in FIG. 7.

It should be further noted that while $IC_A'$ might be able to be constructed/arranged to allow leg switching/jumping and resultant impedance/noise glitches only during predetermined times when the impedance/noise glitches do not affect an internal operation of $IC_A'$, such is still not an adequate solution. More particularly, it should be remembered any generated noise may travel to $IC_B$ (and possibly many other ICs) connected to $IC_A'$ via the transmission lines IL, and may cause erroneous operations therein. It may be very difficult, impossible or non-cost-effective to synchronize operation of all the ICs and construct/arrange $IC_A'$ to allow leg switching/jumping and resultant impedance/noise glitches only during predetermined synchronized times when the impedance/noise glitches would not affect internal operations of any of the other ICs.

Continuing discussion, the above-discussed noise glitches may be especially prevalent during the above-disclosed race/toggle conditions, i.e., a noise glitch being disadvantageously and periodically generated upon each toggling of the counter. Further, note that if the Up/Down Counter were constructed/arranged to allow a wrap-around down count from 00001→11111, or a wrap-around up count from 11111→00001 (both situations represented by the FIG. 6 wrap-around arrow R), a substantial leg/impedance jump between one (1) and thirty-one (31) legs would disadvantageously occur, causing a massive wave launch and/or noise glitch on the lines $L_0$, $L_N$, $L_{N+1}$, ••• and transmission lines $IL_0$, $IL_N$, $IL_{N+1}$, •••. Accordingly, the Up/Down Counter may be constructed/arranged to prohibit wrap-around counting, such prohibition being illustrated by the "X" drawn through the FIG. 6 wrap-around arrow R.

Figure 10:
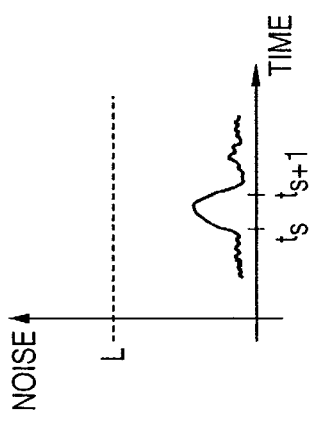
FIG. 10 is a graph describing an advantage of the FIG. 8 linear adaptive arrangement.
Figure 9:
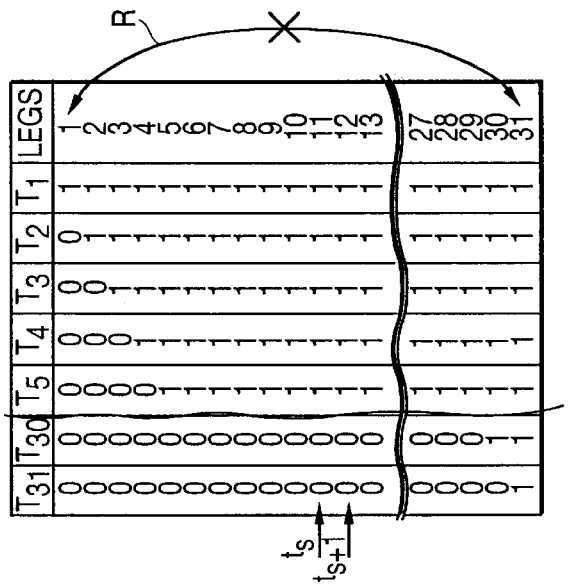
FIG. 9 is a table (having a partial cut-away for compactness of illustration) useful in describing operation of the FIG. 8 linear adaptive arrangement.
Figure 8:
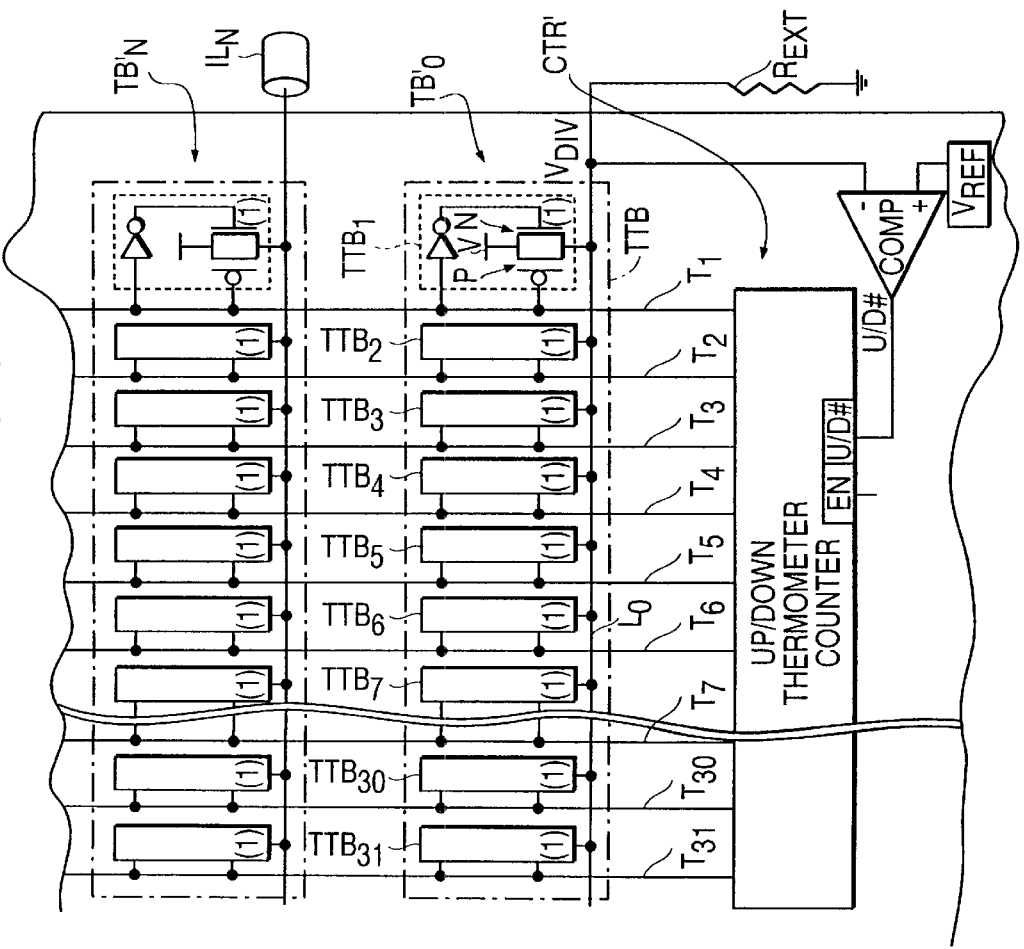
FIG. 8 is a magnified and more detailed, partial cut-away view of a portion of FIG. 4, with FIG. 8 illustrating details of an example linear (thermometer) adaptive arrangement.

Turning now to a differing embodiment, FIG. 8 is a magnified and more detailed view of a portion of FIG. 4, with FIG. 8 illustrating details of an example linear (thermometer) adaptive arrangement. FIG. 9 is a table useful in describing operation of the FIG. 8 adaptive arrangement, and FIG. 10 is a graph describing an advantage of the FIG. 8 adaptive arrangement. Discussion of FIGS. 8, 9, 10 is in many ways similar to the above discussions of FIGS. 5, 6, 7, respectively, and accordingly, the following attempts to avoid redundancy and concentrates on differences for sake of brevity.

In contrast to the FIG. 5 example binary adaptive arrangement, FIG. 8 is directed to an example linear (thermometer) adaptive arrangement. More particularly, whereas the FIG. 5 binary transistor blocks $BTB_1$, $BTB_2$, $BTB_3$, $BTB_4$, $BTB_5$, were binary weighted to contain 1, 2, 4, 8, 16, legs, respectively, the thermometer transistor blocks $TTB_1$, $TTB_2$, $TTB_3$, $TTB_4$, $TTB_5$, $TTB_6$, $TTB_7$, •••, $TTB_{30}$, $TTB_{31}$, are all linearly or equally weighted to contain only one P/N transistor leg each (the designation "(1)" within each such TTB being used to designate the same). Further, in contrast to the FIG. 6 binary count used by the FIG. 5 binary adaptive arrangement, the FIG. 8 linear adaptive arrangement uses a linear count such as that shown in FIG. 9. It is important to note with respect to the FIG. 9 linear count (except for the wrap-around count R which may provide substantial jumping/glitching and may be prohibited as was discussed before with respect to FIG. 6), that an up or down transition from any given count will always result in only one leg being turned on or turned off, while all other legs remain in their pre-existing condition. As only one leg is being turned on or turned off at any given time, e.g., from the time $t_s$ to $t_{s+1}$, the Up/Down Thermometer Counter transitions in count from 00000000000000000000011111111111→00000000000000 00000111111111111, there are no substantial jumps in active P/N transistor legs and thus no substantial jumps in impedance impressed by transistor blocks TB upon lines L and transmission line IL. Accordingly, any noise generated may be substantially below the maximum noise level acceptable by ICs upon the lines L and transmission lines IL, with an example noise being as illustrated in the graph of FIG. 10.

While the FIG. 8 arrangement is advantageous in terms of noise minimization, the FIG. 8 arrangement is disadvantageous in terms of the number of thermometer bit lines which are required, as this linear arrangement has a one-on-one correspondence between thermometer transistor blocks $TTB_1$, $TTB_2$, $TTB_3$, $TTB_4$, $TTB_5$, $TTB_6$, $TTB_7$, •••, $TTB_{30}$, $TTB_{31}$, and thermometer bit lines $T_1$, $T_2$, $T_3$, $T_4$, $T_5$, $T_6$, $T_7$, 108 •• $T_{30}$, $T_{31}$. That is, the FIG. 8 linear arrangement requires thirty-one (31) thermometer bit lines to service thirty-one P/N transistor legs, whereas the FIG. 5 binary arrangement only required five (5) binary bit lines to service the same number of P/N transistor legs. The FIG. 8 arrangement may be an unacceptable on-die arrangement for many ICs, owing to the substantial die real estate and/or design complexity required.

Figure 11:
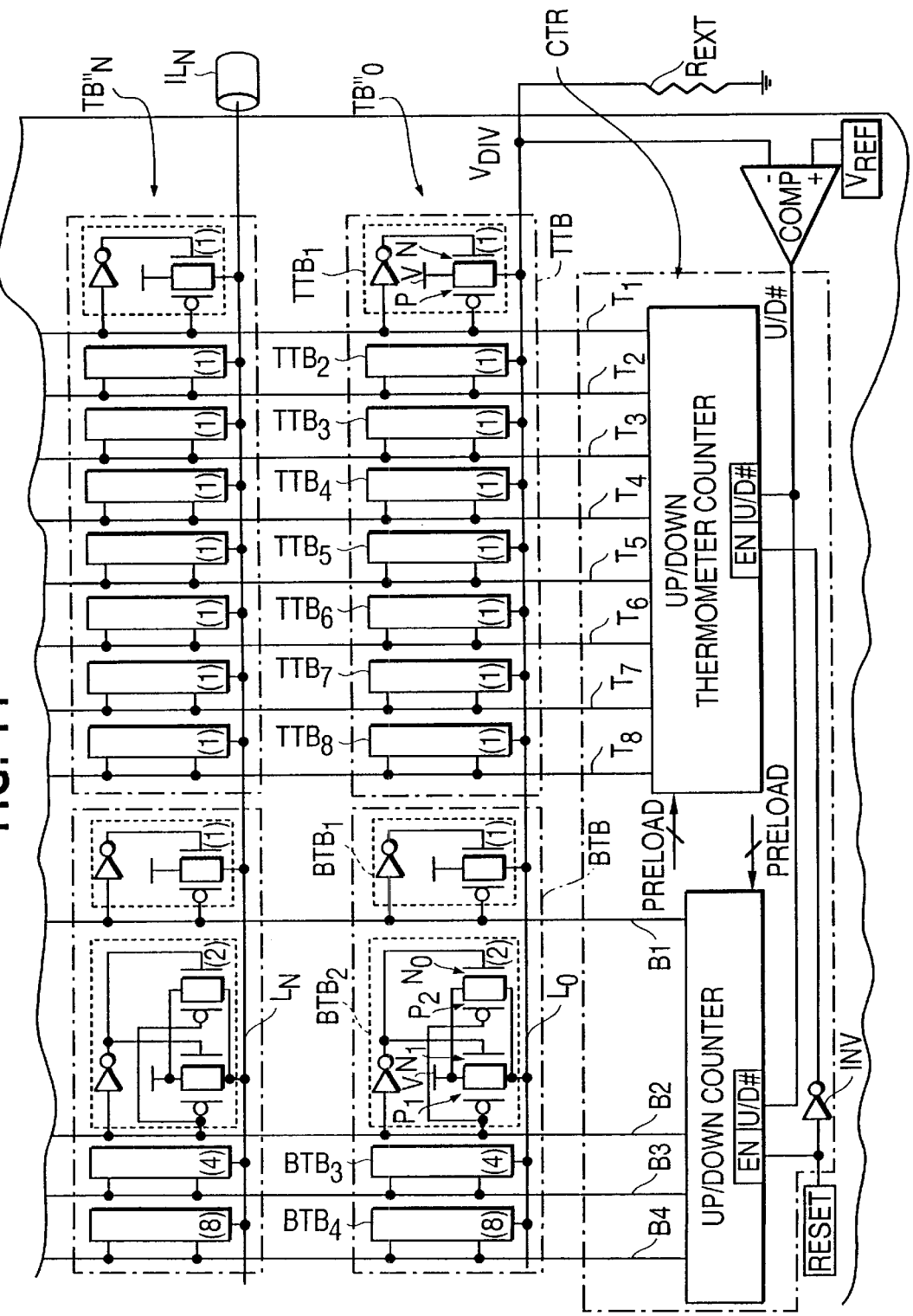
FIG. 11 is a magnified and more detailed view of a portion of FIG. 4, with FIG. 11 illustrating details of an example hybrid binary/linear adaptive arrangement.

Discussion finally turns to FIG. 11 which is a magnified and more detailed view of a portion of FIG. 4, with FIG. 11 illustrating details of an example hybrid binary/linear adaptive arrangement. The FIG. 11 binary/linear adaptive arrangement is in many ways similar to, and includes FIGS. 5-type and 8-type adaptive arrangements. Accordingly, the following attempts to avoid redundancy and to concentrate on differences for sake of brevity.

More particularly, the FIG. 11 hybrid binary/linear adaptive arrangement is constructed/arranged to utilize the best of both worlds of the FIG. 5 binary adaptive arrangement and the FIG. 8 linear adaptive arrangement. That is, as review, the FIG. 5 binary adaptive arrangement is advantageous in terms of minimizing a number of binary bit lines B required to control a given number of P/N transistor legs, but is disadvantageous in terms of impedance/noise glitch generation. However, during an initialization (i.e., reset) time of the system containing $IC_A'$ and $IC_B$, $IC_A'$ and $IC_B$ may not be outputting, sending or receiving signals with respect to the transmission lines IL, and accordingly, any impedance/noise glitches impressed onto the lines L and transmission lines IL may be irrelevant. Accordingly, the FIG. 11 hybrid binary/linear adaptive arrangement contains and utilizes a FIG. 5-type binary adaptive arrangement during initialization to initially adapt to $R_{ext}$, and thereafter locks the FIG. 5-type binary adaptive arrangement to the adapted to impedance such that the FIG. 5-type binary adaptive arrangement cannot generate impedance/noise glitches after initialization. Such locking is illustrated by the lower arrow and darkened block within FIG. 13 which illustrates FIG. 11 concepts with respect to a PVT compensation range.

In continuing the best of both worlds discussion, the FIG. 8 linear adaptive arrangement is advantageous in terms of allowing only one P/N transistor leg to be turned on/off per feedback cycle and thus avoiding generation of any impedance/noise glitches. The reason that the FIG. 8 linear adaptive arrangement may be an unacceptable on-die arrangement for many ICs, is that such arrangement utilized linear bit-lines/transistor-legs in one-to-one correspondence for the entire range of (e.g., thirty-one (31)) transistor legs and thus required excessive (e.g., thirty-one(31)) bit lines. However, with the FIG. 11 arrangement, it has been found that once the above-described binary adaptive arrangement has been used to initially adapt to $R_{ext}$ during initialization, then a range or number of P/N transistor legs needed thereafter to adjust to any expected operational/environmental variations (e.g., voltage, temperature) is relatively small (e.g., eight (8) legs). Accordingly, the FIG. 11 hybrid binary/linear adaptive arrangement contains and utilizes a FIG. 8-type linear adaptive arrangement after initialization to continuously/periodically readapt to $R_{ext}$ to compensate for operational/environmental variations, while avoiding impedance/noise glitches after initialization. A range of linear (thermometer) legs which can be used for adaptive correction after reset is illustrated by the upper arrow and dotted box within FIG. 13.

In summarizing the hybrid binary/linear adaptive construction/arrangement of FIG. 11, a left-hand portion of transistor block $TB_0$" in FIG. 11 represents a binary adaptive portion including binary transistor blocks $BTB_1$, $BTB_2$, $BTB_3$, $BTB_4$, serviced by four (4) binary bit lines $B_1$, $B_2$, $B_3$, $B_4$, and a right-hand portion represents a linear adaptive portion including thermometer transistor blocks $TTB_1$, $TTB_2$, $TTB_3$, $TTB_4$, $TTB_5$, $TTB_6$, $TTB_7$, $TTB_8$, serviced by eight (8) thermometer bit lines $T_1$, $T_2$, $T_3$, $T_4$, $T_5$, $T_6$, $T_7$, $T_8$. With regard to the FIG. 11 example embodiment, twelve (12) bit lines have been provided to control twenty-three (23) P/N transistor legs. The present invention is not limited to the FIG. 11 numbers and/or division of binary and linear P/N transistor legs, and other numbers and/or divisions may be used.

More particularly, with regard to a number of P/N transistor legs which should be provided both within the binary adaptive portion and within the linear adaptive portion, such must be determined on a case-by-case basis for each implementation. Basically, the binary adaptive portion should contain an adequate number of P/N transistor legs to provide a sufficient range of impedance matching before reset, taking into consideration all possible variations which might affect impedance matching (e.g., process variations to manufacture the die which might in turn affect the impedance provided by each P/N transistor leg; variations in impedance values of possible transmission lines IL which might be connected to the die, etc.). In turn, the linear adaptive portion should contain an adequate number of P/N transistor legs to provide a sufficient range of impedance matching for adaptive correction after reset, taking into consideration all possible parameters which might affect a range needed for adaptive correction (e.g., operating temperature range of the die and the effects of temperature variations on the die, range of possible voltage variations, etc.).

Discussion continues with further construction and operational details of the FIG. 11 arrangement. More particularly, the FIG. 11 arrangement has both an Up/Down Counter which services the binary bit lines $B_1$, $B_2$, $B_3$, $B_4$, and a Up/Down Thermometer Counter which services the thermometer bit lines $T_1$, $T_2$, $T_3$, $T_4$, $T_5$, $T_6$, $T_7$, $T_8$. Within the FIG. 11 example arrangement, the counters are arranged to operate at differing times, i.e., through the use of an inverter INV which causes opposing enabling signals to be applied to the two counters.

More particularly, FIG. 12 is a table describing example operations with respect to binary and linear (thermometer) bits and counters of the FIG. 11 example hybrid binary/linear adaptive arrangement. Columns within FIG. 12 show a representation of the FIG. 11 binary bit lines and thermometer bit lines. A first row within FIG. 12 shows the number or legs (aka, bit weights) provided by the various binary bit lines and thermometer bit lines. Second and third rows show the status of the counter/bit-lines during and after reset.

More particularly, during reset (FIG. 12 row 2), the Up/Down Counter and binary bit lines $B_1$, $B_2$, $B_3$, $B_4$, are tracking or adapting to match $R_{ext}$, i.e., an activating signal (enabling counting) is applied to the enable EN input of the Up/Down Counter. In contrast, during reset, the Up/Down Thermometer Counter and thermometer bit lines $T_1$, $T_2$, $T_3$, $T_4$, $T_5$, $T_6$, $T_7$, $T_8$ may be preset and held, e.g., to have half of the linear P/N transistor legs activated (designated by 1's) and half deactivated (designated by 0's), such that the linear adaptive portion begins at mid-scale within its operational range to allow room/capability for adaptive correction in either an up or down direction after reset. During reset time, the Up/Down Thermometer Counter receives a deactivating signal (disabling counting) to its enable EN input, courtesy of the inverter INV.

After reset (FIG. 12 bottom row), a deactivating signal (disabling further counting) is applied to the enable EN input of the Up/Down Counter, such that the Up/Down Counter and binary bit lines $B_1$, $B_2$, $B_3$, $B_4$, are locked and held at the value which was found during initialization to match $R_{ext}$, i.e., lock also being illustrated by the lower arrow and darkened block within FIG. 13. In contrast, an activating signal (enabling counting) is applied to the enable EN input of the Up/Down Thermometer Counter, such that the Up/Down Thermometer Counter and thermometer bit lines $T_1$, $T_2$, $T_3$, $T_4$, $T_5$, $T_6$, $T_7$, $T_8$ are no longer held and are allowed to track for adaptive correction after reset in either an up (add additional P/N transistor legs) or down (remove P/N transistor legs) direction. Again, a range of linear (thermometer) legs which can be used for adaptive correction after reset is illustrated by the upper arrow and dotted box within FIG. 13.

As a further feature to add further value to the FIG. 11 arrangement, preload input terminals (FIG. 11) of the Up/Down Counter and/or the Up/Down Thermometer Counter may be used to preload desired count values into the counters, for example, to facilitate testing of the adaptive arrangements of the present invention, and/or to force the transistor blocks to a predetermined impedance value.

While the above FIG. 11 example embodiment focused on an arrangement concerning a binary adaptive arrangement in conjunction with a linear adaptive arrangement, the present invention is not limited thereto. For example, the present invention could just as easily be practiced with other combinations of adaptive arrangements. As a first alternative example, a left-hand portion of FIG. 11 does not have to be a binary adaptive arrangement, but instead could be more generalized to any nonlinear adaptive arrangement. As another alternative example, the left-hand portion of FIG. 11 could even be another linear adaptive arrangement having different weighting than the linear adaptive arrangement of the right-hand portion of FIG. 11. For example, whereas the right-hand portion of FIG. 11 has bit-lines/transistor-legs in a linear one-to-one correspondence for linear weighting of one (1), the left-hand portion of FIG. 11 may have bit-lines/transistor-legs in a linear one-to-four correspondence for linear weighting of four (4). Such one-to-four linear adaptive portion could then be used during initialization to roughly adapt to $R_{ext}$ with a granularity of four P/N transistor legs (with impedance/noise jumping during a reset time when noise is irrelevant), and after reset, the one-to-one linear adaptive portion could be used to finely adapt to $R_{ext}$ (thus avoiding unacceptable noise during actual operation).

This concludes the description of the preferred embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An impedance matching arrangement, comprising:
an adaptive circuit comprising:
a first adaptive portion having a plurality of first weighting stages allowing impedance matching according to a predetermined first weighting scheme, impedance matching weights of said plurality of first weighting stages being combinable with each other in varying combinations to obtain differing degrees of impedance matching; and
a second adaptive portion having a plurality of second weighting stages allowing impedance matching according to a predetermined second weighting scheme which differs from said first weighting scheme, impedance matching weights of said plurality of second weighting stages being combinable with each other in varying combinations to obtain differing degrees of impedance matching.

2. An impedance matching arrangement as claimed in claim 1, wherein said first adaptive portion and said second adaptive portion are arranged to be operable for substantially mutually differing times.

3. An impedance matching arrangement as claimed in claim 2, wherein said first adaptive portion is operable substantially during initialization times, and said second adaptive portion is operable substantially outside initialization times.

4. An impedance matching arrangement as claimed in claim 1, at least one of said plurality of first weighting stages and said plurality of second weighting stages is provided as parallel stages.

5. An impedance matching arrangement as claimed in claim 1, at least one of said plurality of first weighting stages and said plurality of second weighting stages is provided as in-series stages.

6. An impedance matching arrangement as claimed in claim 1, wherein said first adaptive portion is a first linear adaptive portion having a predetermined first linear weighting, and said second adaptive portion is a second linear adaptive portion having a predetermined second linear weighting which differs from said first linear weighting.

7. An impedance matching arrangement as claimed in claim 1, wherein said adaptive circuit is provided as a portion of an integrated circuit (IC) die.

8. An impedance matching arrangement as claimed in claim 1, wherein said adaptive circuit has a preload arrangement for allowing at least one of said first adaptive portion and said second adaptive portion to be preloaded to provide a predetermined impedance matching value.

9. An impedance matching arrangement, comprising:
an adaptive circuit means comprising:
a first adaptive means having a plurality of first weighting stages for allowing impedance matching according to a predetermined first weighting scheme, impedance matching weights of said plurality of first weighting stages being combinable with each other in varying combinations to obtain differing degrees of impedance matching; and
a second adaptive means having a plurality of second weighting stages for allowing impedance matching according to a predetermined second weighting scheme which differs from said first weighting scheme.

10. An impedance matching arrangement as claimed in claim 9, wherein said first adaptive means and said second adaptive means are arranged to be operable for substantially mutually differing times.

11. An impedance matching arrangement as claimed in claim 10, wherein said first adaptive means is operable substantially during initialization times, and said second adaptive means is operable substantially outside initialization times.

12. An impedance matching arrangement as claimed in claim 9, at least one of said plurality of first weighting stages and said plurality of second weighting stages is provided as parallel stages.

13. An impedance matching arrangement as claimed in claim 9, at least one of said plurality of first weighting stages and said plurality of second weighting stages is provided as in-series stages.

14. An impedance matching arrangement as claimed in claim 9, wherein said first adaptive means is a first linear adaptive means having a predetermined first linear weighting, and said second adaptive means is a second linear adaptive means having a predetermined second linear weighting which differs from said first linear weighting.

15. An impedance matching arrangement as claimed in claim 9, wherein said adaptive circuit means is provided as a portion of an integrated circuit (IC) die.

16. An impedance matching arrangement as claimed in claim 9, wherein said adaptive circuit means has a preload arrangement for allowing at least one of said first adaptive means and said second adaptive means to be preloaded to provide a predetermined impedance matching value.

17. An impedance matching method, comprising the steps of:
impedance matching with a plurality of first weighting stages according to a predetermined first weighting scheme during initialization, impedance matching weights of said plurality of first weighting stages being combinable with each other in varying combinations to obtain differing degrees of impedance matching; and
impedance matching with a plurality of second weighting stages according to a predetermined second weighting scheme which differs from said first weighting scheme, after initialization, impedance matching weights of said plurality of second weighting stages being combinable with each other in varying combinations to obtain differing degrees of impedance matching.

18. An impedance matching arrangement as claimed in claim 17, at least one of said plurality of first weighting stages and said plurality of second weighting stages is provided as parallel stages.

19. An impedance matching arrangement as claimed in claim 17, at least one of said plurality of first weighting stages and said plurality of second weighting stages is provided as in-series stages.

20. An impedance matching arrangement comprising:
an adaptive circuit comprising:
a first adaptive portion allowing impedance matching according to a predetermined first weighting scheme;
a second adaptive portion allowing impedance matching according to a predetermined second weighting scheme which differs from said first weighting scheme; and
a plurality of said adaptive circuits including a reference adaptive circuit which is operable to adapt to a predetermined impedance, and wherein at least one adaptive circuit of said plurality of adaptive circuits is adapted to utilize information from said reference adaptive circuit to adjust adaptive portions thereof in a same way.

21. An impedance matching arrangement comprising:
an adaptive circuit comprising:
- a first adaptive portion allowing impedance matching according to a predetermined first weighting scheme;
- a second adaptive portion allowing impedance matching according to a predetermined second weighting scheme which differs from said first weighting scheme; and
- wherein said first adaptive portion has a binary weighting scheme, and said second adaptive portion has a linear weighting scheme.

22. An impedance matching arrangement comprising:
an adaptive circuit means comprising:
- a first adaptive means for allowing impedance matching according to a predetermined first weighting scheme;
- a second adaptive means for allowing impedance matching according to a predetermined second weighting scheme which differs from said first weighting scheme; and
- a plurality of said adaptive circuit means including a reference adaptive circuit means which is operable to adapt to a predetermined impedance, and wherein at least one adaptive circuit means of said plurality of adaptive circuits means is adapted to utilize information from said reference adaptive circuit means to adjust adaptive portions thereof in a same way.

23. An impedance matching arrangement comprising:
an adaptive circuit means comprising:
- a first adaptive means for allowing impedance matching according to a predetermined first weighting scheme;
- a second adaptive means for allowing impedance matching according to a predetermined second weighting scheme which differs from said first weighting scheme; and
- wherein said first adaptive means has a binary weighting scheme, and said second adaptive means has a linear weighting scheme.

* * * * *

UNITED STATES PATENT AND TRADEMARK OFFICE
CERTIFICATE OF CORRECTION

| | |
|---|---|
| PATENT NO. | : 6,326,802 B1 |
| DATED | : December 4, 2001 |
| INVENTOR(S) | : Newman et al. |

It is certified that error appears in the above-identified patent and that said Letters Patent is hereby corrected as shown below:

<u>Title page,</u>
Item [75], Iventors: "Chee Bow Lim" should be changed to -- Chee How Lim --.

Signed and Sealed this

Nineteenth Day of March, 2002

Attest:

JAMES E. ROGAN
*Director of the United States Patent and Trademark Office*

*Attesting Officer*